(12) United States Patent
Lin et al.

(10) Patent No.: US 10,280,076 B2
(45) Date of Patent: May 7, 2019

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Hung-Hua Lin, Taipei (TW); Ping-Yin Liu, Taipei County (TW); Kuan-Liang Liu, Pingtung County (TW); Chia-Shiung Tsai, Hsin-Chu (TW); Alexander Kalnitsky, San Francisco, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/130,077

(22) Filed: Apr. 15, 2016

(65) Prior Publication Data
US 2017/0297902 A1  Oct. 19, 2017

(51) Int. Cl.
*B81C 1/00* (2006.01)

(52) U.S. Cl.
CPC .. *B81C 1/00269* (2013.01); *B81B 2201/0235* (2013.01); *B81B 2201/0242* (2013.01); *B81B 2207/012* (2013.01); *B81B 2207/07* (2013.01); *B81B 2207/092* (2013.01); *B81C 2203/0118* (2013.01); *B81C 2203/036* (2013.01); *B81C 2203/0792* (2013.01)

(58) Field of Classification Search
CPC ..... H01L 23/5389; H01L 24/27; H01L 24/83; H01L 24/19; H01L 24/29; B81B 7/0041; B81B 7/007; B81B 3/0021; B81B 7/0064; B81B 7/008; B81C 1/00269; B81C 1/00293; B81C 1/00301; B81C 1/00238; B81C 1/0023
USPC .......... 257/415, 619, 774, 417; 438/51, 629, 438/459, 55, 64
See application file for complete search history.

(56) References Cited

U.S. PATENT DOCUMENTS

| | | | |
|---|---|---|---|
| 8,987,059 B2 | 3/2015 | Liang et al. |
| 9,040,334 B2 | 5/2015 | Chu et al. |
| 9,065,358 B2 | 6/2015 | Tsai et al. |
| 9,085,455 B2 | 7/2015 | Cheng et al. |
| 9,085,456 B2 | 7/2015 | Tsai et al. |
| 9,122,827 B2 | 9/2015 | Chen et al. |
| 9,133,017 B2 | 9/2015 | Liang et al. |
| 9,138,994 B2 | 9/2015 | Peng et al. |
| 9,139,420 B2 | 9/2015 | Chang et al. |
| 9,139,423 B2 | 9/2015 | Chien et al. |
| 9,181,083 B2 | 11/2015 | Tsai et al. |

(Continued)

*Primary Examiner* — Mouloucoulaye Inoussa
(74) *Attorney, Agent, or Firm* — WPAT, P.C., Intellectual Property Attorneys; Anthony King

(57) ABSTRACT

A semiconductor structure includes a first substrate including a cavity extended into the first substrate, a device disposed within the cavity, a first dielectric layer disposed over the first substrate and a first conductive structure surrounded by the first dielectric layer, and a second substrate including a second dielectric layer disposed over the second substrate and a second conductive structure surrounded by the second dielectric layer, wherein the first conductive structure is bonded with the second conductive structure and the first dielectric layer is bonded with the second dielectric layer to seal the cavity.

20 Claims, 10 Drawing Sheets

(56) References Cited

U.S. PATENT DOCUMENTS

| | | |
|---|---|---|
| 9,187,317 B2 | 11/2015 | Cheng et al. |
| 9,233,839 B2 | 1/2016 | Liu et al. |
| 9,236,877 B2 | 1/2016 | Peng et al. |
| 9,238,581 B2 | 1/2016 | Wu et al. |
| 2004/0262716 A1* | 12/2004 | Aoki .................. H01L 23/5389 |
| | | 257/619 |
| 2010/0059876 A1* | 3/2010 | Shimizu ............. H01L 23/5389 |
| | | 257/700 |
| 2014/0061730 A1* | 3/2014 | Peng .................... B81B 7/0064 |
| | | 257/254 |
| 2014/0252508 A1* | 9/2014 | Cheng ................ B81C 1/00246 |
| | | 257/415 |
| 2014/0287548 A1 | 9/2014 | Lin et al. |
| 2015/0137303 A1 | 5/2015 | Chou et al. |
| 2015/0175405 A1 | 6/2015 | Cheng |
| 2015/0175407 A1 | 6/2015 | Cheng et al. |
| 2015/0196912 A1 | 7/2015 | Tsai et al. |

* cited by examiner

SEMICONDUCTOR STRUCTURE AND MANUFACTURING METHOD THEREOF

BACKGROUND

Electronic equipment involving semiconductive devices are essential for many modern applications. The semiconductive device has experienced rapid growth. Technological advances in materials and design have produced generations of semiconductive devices where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductive devices.

Micro-electro mechanical system (MEMS) devices have been recently developed and are also commonly involved in electronic equipment. The MEMS device is micro-sized device, usually in a range from less than 1 micron to several millimeters in size. The MEMS device includes fabrication using semiconductive materials to form mechanical and electrical features. The MEMS device may include a number of elements (e.g., stationary or movable elements) for achieving electro-mechanical functionality. For many applications, MEMS device is electrically connected to external circuitry to form complete MEMS systems. Commonly, the connections are formed by wire bonding. MEMS devices are widely used in various applications. MEMS applications include motion sensor, gas detectors, pressure sensors, printer nozzles, or the like. Moreover, MEMS applications are extended to optical applications, such as movable mirrors, and radio frequency (RF) applications, such as RF switches or the like.

As technologies evolve, design of the devices becomes more complicated in view of small dimension as a whole and increase of functionality and amounts of circuitries. Numerous manufacturing operations are implemented within such a small and high performance semiconductor device. The manufacturing of the semiconductor device in a miniaturized scale becomes more complicated. The increase in complexity of manufacturing may cause deficiencies such as high yield loss, poor reliability of the electrical interconnection, warpage, etc. Therefore, there is a continuous need to modify structure and manufacturing method of the devices in the electronic equipment in order to improve the device performance as well as reduce manufacturing cost and processing time.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
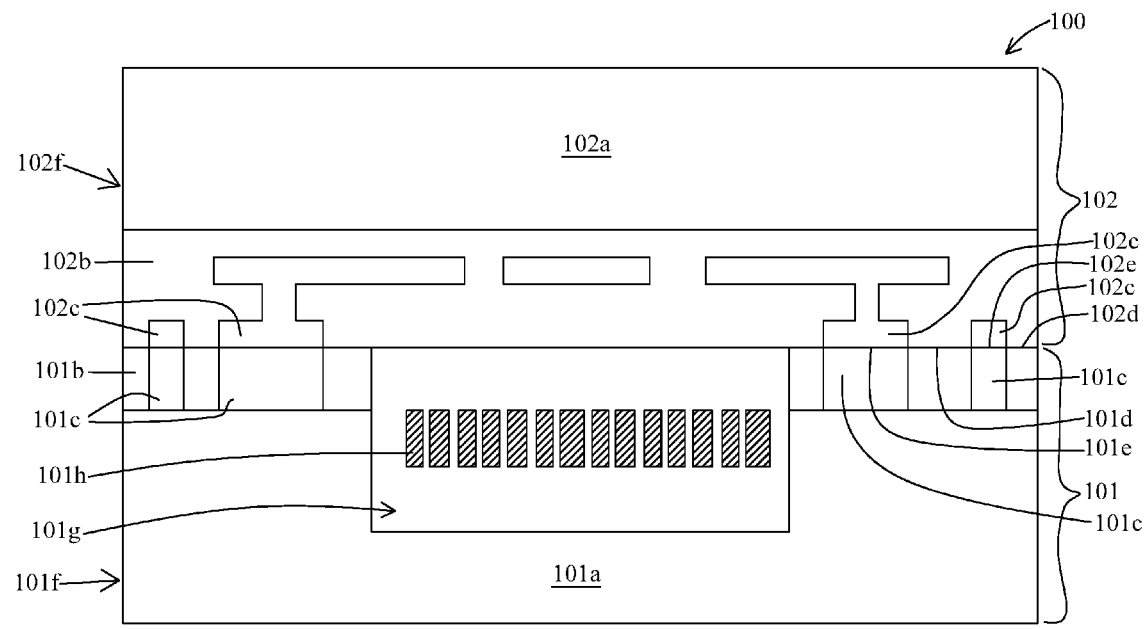
FIG. 1 is a schematic view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An electronic equipment can include multiple MEMS sensors, and those sensors can be integrated onto a semiconductive chip in recent generation of MEMS applications. For example, motion or inertial sensors are used for motion-activated user interfaces in consumer electronics such as smartphones, tablets, gaming consoles, and in automotive crash detection systems. To capture a complete range of movements within a three-dimensional space, motion sensors often utilize an accelerometer and a gyroscope in combination. The accelerometer detects linear movement, and the gyroscope detects angular movement. In addition, a magnetic sensor such as electronic compass is also integrated onto the chip for navigation. The magnetic sensor can determine a direction of an external magnetic field. To meet consumer's demand for low cost, high quality, and small device footprint, multiple sensors are integrated together on a same substrate.

A MEMS package is fabricated by various processes. The MEMS package includes a substrate eutectically bonded with another substrate and a MEMS device enclosed by a cavity of one of the substrates. The eutectic bonding of the substrates has to be performed under a high temperature (for example, greater than 400° C.) and requires application of a large compressive force (for example, greater than 30,000N) on the substrates during the bonding. Such a high temperature or a large compressive force would cause thermal internal stress to the MEMS package, cracks in the substrates or damage on electrical interconnects in the substrates. As a result, reliability and performance of the MEMS package would be adversely affected.

The present disclosure is directed to a semiconductor structure including a substrate bonded with another substrate. The substrates are bonded by directly bonding conductive structures respectively disposed over the substrates and directly bonding dielectric layers respectively disposed over the substrates. Such bonding of the substrates can be performed under a low temperature (for example, lower than 250° C.), and the substrates can be bonded without application of a compressive force on the substrates. Therefore, the semiconductor structure would not be damaged by a high temperature or a large force. Furthermore, since the semiconductor structure would not under a high temperature during bonding, a device such as an accelerometer, which would be easily deteriorated by high temperature (for example, greater than 300° C.), would not be affected by high temperature and thus can be formed over the substrates before the bonding operations. Other embodiments are also disclosed.

FIG. 1 is a schematic cross sectional view of a semiconductor structure 100 in accordance with some embodiments of the present disclosure. In some embodiments, the semiconductor structure 100 is configured for sensing various characteristics such as motion, movement, magnetic field, pressure or etc. or combination thereof. In some embodiments, the semiconductor structure 100 includes a first substrate 101 and a second substrate 102 stacked over the first substrate 101. It will be appreciated that the semiconductor structure 100 may include one or more substrates stacking over another.

In some embodiments, the semiconductor structure 100 includes the first substrate 101. In some embodiments, the first substrate 101 may include several circuitries and one or more active elements such as transistors etc. disposed over or in the first substrate 101. In some embodiments, the circuitries formed over or in the first substrate 101 may be any type of circuitry suitable for a particular application. In some embodiments, the first substrate 101 is a MEMS substrate.

In some embodiments, the first substrate 101 includes a first substrate layer 101a. In some embodiments, several circuitries or metallic structures are disposed over or within the first substrate layer 101a. In some embodiments, the first substrate layer 101a includes semiconductive materials such as silicon or other suitable materials. In some embodiments, the first substrate layer 101a is a silicon substrate or silicon wafer. In some embodiments, transistors, capacitors, resistors, diodes, photo-diodes and/or the like are disposed over the first substrate layer 101a.

In some embodiments, the first substrate 101 includes a first dielectric layer 101b disposed over the first substrate 101 or the first substrate layer 101a. In some embodiments, the first dielectric layer 101b is conformal to a surface of the first substrate layer 101a. In some embodiments, the first dielectric layer 101b includes dielectric material such as oxide, nitride, silicon dioxide, silicon nitride, silicon oxynitride, silicon carbide, polymer or the like.

In some embodiments, the first substrate 101 includes a first conductive structure 101c surrounded by the first dielectric layer 101b. In some embodiments, the first conductive structure 101c is extended and disposed within the first dielectric layer 101b. In some embodiments, the first conductive structure 101c is electrically connected with the circuitry in the first substrate layer 101a. In some embodiments, the first conductive structure 101c is laterally extended over the first substrate layer 101a and within the first dielectric layer 101b. In some embodiments, the first conductive structure 101c is laterally extended along a periphery 101f of the first substrate 101, over the first substrate layer 101a and within the first dielectric layer 101b.

In some embodiments, the first conductive structure 101c is in a partially closed loop or in a ring shape. In some embodiments, the first conductive structure 101c is a bond ring. In some embodiments, the first conductive structure 101c is a sealing ring for sealing the cavity 101g. In some embodiments, the first conductive structure 101c includes conductive or metallic material such as gold, silver, copper, nickel, tungsten, aluminum, tin and/or alloys thereof. In some embodiments, the first dielectric layer 101b includes a top surface 101d, and the first conductive structure 101c includes a top surface 101e, and the top surface 101d of the first dielectric layer 101b is at a same level as the top surface 110e of the first conductive layer 101c.

In some embodiments, the first substrate 101 includes a cavity 101g extended into the first substrate 101 or the first substrate layer 101a. In some embodiments, the cavity 101g is extended from the first dielectric layer 101b to the first substrate layer 101a. In some embodiments, the cavity 101g is defined by the first dielectric layer 101b to the first substrate layer 101a. In some embodiments, the cavity 101g is recessed into the first dielectric layer 101b and the first substrate layer 101a.

In some embodiments, the first substrate 101 includes a device 101h disposed within the cavity 101g. In some embodiments, the device 101h is displaceable or movable relative to the first substrate layer 101a and the first dielectric layer 101b. In some embodiments, the device 101h is configured for sensing one or more characteristics such as motion, movement, pressure or etc. or combination thereof. In some embodiments, the device 101h includes a proof mass for reacting with a motion along a plane. In some embodiments, the device 101h is a MEMS device. In some embodiments, the device 101h is an accelerometer for measuring linear acceleration. In some embodiments, the device 101h is a gyroscope for measuring angular velocity.

In some embodiments, the semiconductor structure 100 includes the second substrate 102. In some embodiments, the second substrate 102 may include several circuitries and one or more active elements such as transistors etc. disposed over or in the second substrate 102. In some embodiments, the circuitries formed over or in the second substrate 102 may be any type of circuitry suitable for a particular application. In some embodiments, the second substrate 102 is a CMOS substrate. In some embodiments, the second substrate 102 includes several CMOS components or devices.

In some embodiments, the second substrate 102 is disposed opposite to the first substrate 101. In some embodiments, the second substrate 102 is disposed over or stacked over the first substrate 101. In some embodiments, the first substrate 101 is aligned with the second substrate 102. In some embodiments, the periphery 101f of the first substrate 101 is vertically aligned with a periphery 102f of the second substrate 102. In some embodiments, the second substrate 102 includes a second substrate layer 102a. In some embodiments, several circuitries or metallic structures are disposed over or within the second substrate layer 102a. In some embodiments, the second substrate layer 102a includes semiconductive materials such as silicon or other suitable materials. In some embodiments, the second substrate layer 102a is a silicon substrate or silicon wafer. In some embodiments, transistors, capacitors, resistors, diodes, photo-diodes and/or the like are disposed over the second substrate layer 102a. In some embodiments, the second substrate layer 102a has similar configuration as the first substrate layer 101a described above or illustrated in FIG. 1.

In some embodiments, the second substrate 102 includes a second dielectric layer 102b disposed over the second substrate 102 or the second substrate layer 102a. In some embodiments, the second dielectric layer 102b is disposed opposite to the first dielectric layer 101b. In some embodiments, the second dielectric layer 102b is conformal to a surface of the second substrate layer 102a.

In some embodiments, at least a portion of the second dielectric layer 102b is bonded with a portion of the first dielectric layer 101b. In some embodiments, at least a portion of the second dielectric layer 102b is directly bonded or interfaced with a portion of the first dielectric layer 101b. In some embodiments, the cavity 101g is enclosed by the first substrate 101 and the second dielectric layer 102b. In some embodiments, the cavity 101g is enclosed by the first substrate layer 101a, the first dielectric layer 101b and the second dielectric layer 102b.

In some embodiments, the first dielectric layer 101b is aligned with the second dielectric layer 102b. In some embodiments, the second dielectric layer 102b includes a top surface 102d interfaced and aligned with the top surface 101d of the first dielectric layer 101b. In some embodiments, a portion of the first dielectric layer 101b is bonded with a portion of the second dielectric layer 102b to seal the cavity 101g. In some embodiments, the cavity 101g is sealed or is hermetic. In some embodiments, the cavity 101g is in vacuum or is at a gas pressure lower than about 1 atmospheric pressure (atm).

In some embodiments, the second dielectric layer 102b includes dielectric material such as oxide, nitride, silicon dioxide, silicon nitride, silicon oxynitride, silicon carbide, polymer or the like. In some embodiments, the second dielectric layer 102b includes same material as or different material from the first dielectric layer 101b. In some embodiments, the second dielectric layer 102b has similar configuration as the first dielectric layer 101b described above or illustrated in FIG. 1.

In some embodiments, the second substrate 102 includes a second conductive structure 102c surrounded by the second dielectric layer 102b. In some embodiments, the second conductive structure 102c is extended and disposed within the second dielectric layer 102b. In some embodiments, the second conductive structure 102c is electrically connected with the circuitry in the second substrate layer 102a. In some embodiments, the second conductive structure 102c is laterally extended over the second substrate layer 102a and within the second dielectric layer 102b. In some embodiments, the second conductive structure 102c is a part of a redistribution layer (RDL). In some embodiments, the second conductive structure 102c is laterally extended along the periphery 102f of the second substrate 102, over the second substrate layer 102a and within the second dielectric layer 102b. In some embodiments, a conductive via or conductive plug is disposed over and extended from the second conductive structure 102c for signal routing. In some embodiments, an electrical signal from the second conductive structure 102c can be picked from the second conductive structure 102c through the conductive via or the conductive plug. In some embodiments, the conductive via or conductive plug extends through the second dielectric layer 102b or the second substrate layer 102a.

In some embodiments, the second conductive structure 102c is in a partially closed loop or in a ring shape. In some embodiments, the second conductive structure 102c is a bond ring. In some embodiments, the second conductive structure 102c is a sealing ring for sealing the cavity 101g. In some embodiments, the second conductive structure 102c includes conductive or metallic material such as gold, silver, copper, nickel, tungsten, aluminum, tin and/or alloys thereof. In some embodiments, the second conductive structure 102c includes same material as or different material from the first conductive structure 101c. In some embodiments, the second conductive structure 102c includes a top surface 102e, which is at a same level as the top surface 102d of the second dielectric layer 102b.

In some embodiments, the second conductive structure 102c is disposed over or opposite to the first conductive structure 101c. In some embodiments, the first conductive structure 101c is aligned with the second conductive structure 102c. In some embodiments, the top surface 101e of the first conductive structure 101c is interfaced and aligned with the top surface 102e of the second conductive structure 102c. In some embodiments, the first conductive structure 101c is bonded with the second conductive structure 102c. In some embodiments, at least a portion of the first conductive structure 101c is directly bonded or interfaced with a portion of the second conductive structure 102c. In some embodiments, the first conductive structure 101c is bonded with the second conductive structure 102c, such that the cavity 101g is sealed or hermetic.

In some embodiments, the first conductive structure 101c is complementary to the second conductive structure 102c. In some embodiments, the first conductive structure 101c is structurally complementary to the second conductive structure 102c. In some embodiments, a dimension of the first conductive structure 101c is similar to a dimension of the second conductive structure 102c. In some embodiments, the top surface 101e of the first conductive structure 101c has similar dimension as the top surface 102e of the second conductive structure 102c.

Figure 1A:
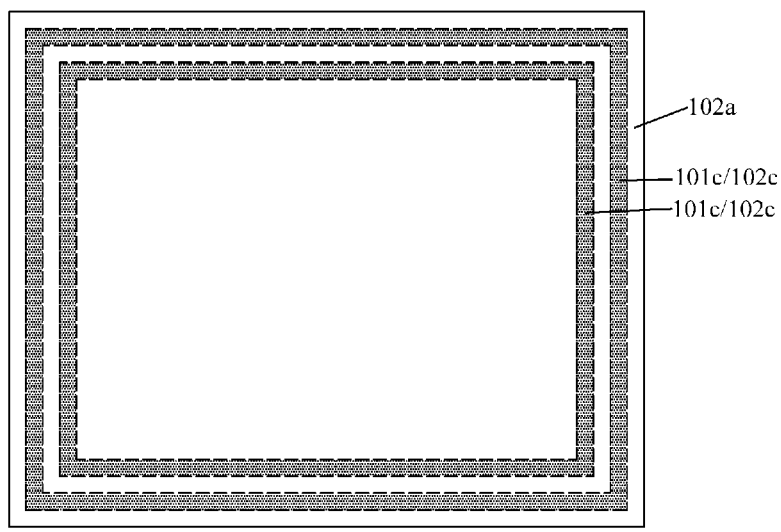
FIG. 1A is a schematic top view of a semiconductor structure in accordance with some embodiments of the present disclosure.

In some embodiments, the first conductive structure 101c is bonded with and electrically connected with the second conductive structure 102c, such that the first substrate 101 is integrated with the second substrate 102. In some embodiments, the circuitry of the first substrate 101 is electrically connected with the circuitry of the second substrate 102. In some embodiments, the first conductive structure 101c or the second conductive structure 102c is electrically connected with the circuitry disposed over the second substrate layer 102a or within the second dielectric layer 102b. In some embodiments, the second conductive structure 102c is electrically connected with the circuitry in the second dielectric layer 102b through a via extending within the second dielectric layer 102b. In some embodiments as shown in FIG. 1A (a top cross sectional view of the semiconductor structure 100), the first conductive structure 101c or the second conductive structure 102c is configured in a closed loop shape or an annular shape. In some embodiments as shown in FIG. 1A, more than one first conductive structure 101c is configured and extended over the first substrate layer 101a. In some embodiments, more than one second conductive structure 102c is configured and extended over the first substrate layer 101a. In some embodiments, the sealing of the cavity 101g can be advanced or the protection of the device 101h from moisture or contamination can be reinforced by increasing a number of loops of the first conductive structures 101c or the second conductive structures 102c.

Figure 2:
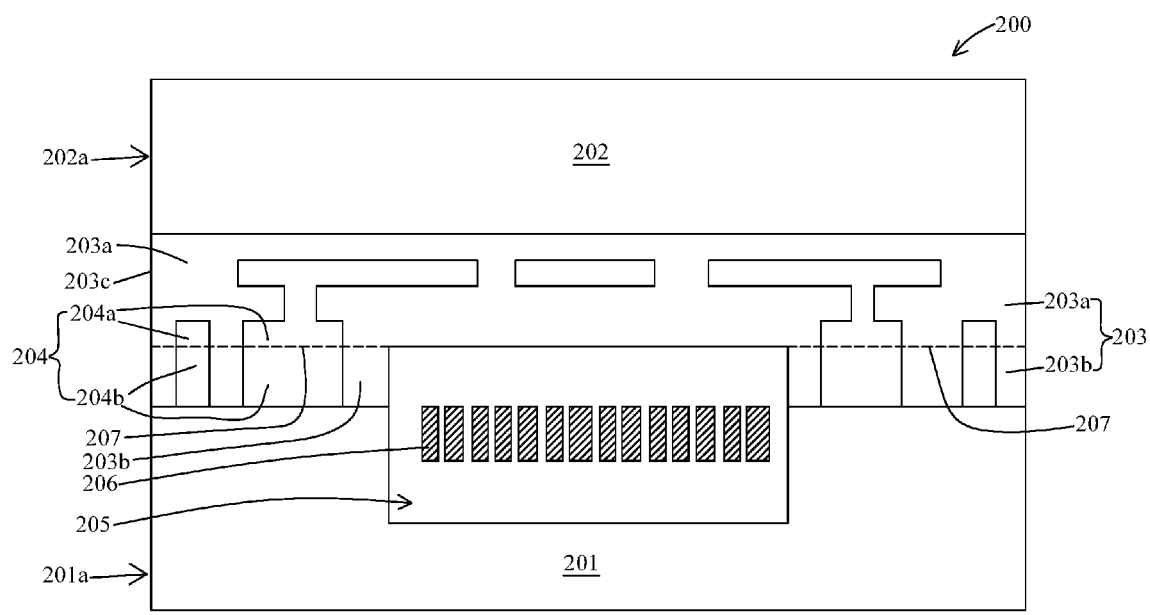
FIG. 2 is a schematic view of a semiconductor structure in accordance with some embodiments of the present disclosure.

FIG. 2 is a schematic cross sectional view of a semiconductor structure 200 in accordance with some embodiments of the present disclosure. In some embodiments, the semiconductor structure 200 is configured for sensing various characteristics such as motion, movement or etc. In some embodiments, the semiconductor structure 200 includes a first substrate 201, a second substrate 202, a dielectric layer 203, a conductive structure 204, a chamber 205 and a device 206 and an interface 207.

In some embodiments, the second substrate 202 is disposed opposite to the first substrate 201. In some embodiments, the second substrate 202 is stacked over the first substrate 201. It will be appreciated that the semiconductor structure 200 may include one or more substrates stacking over another. In some embodiments, the first substrate 201 is aligned with the second substrate 202.

In some embodiments, the first substrate 201 may include several circuitries and one or more active elements such as transistors etc. disposed over or in the first substrate 201. In some embodiments, the circuitries formed over or in the first substrate 201 may be any type of circuitry suitable for a particular application. In some embodiments, the first substrate 201 is a MEMS substrate. In some embodiments, the first substrate 201 includes semiconductive materials such as silicon or other suitable materials. In some embodiments, the first substrate 201 is a silicon substrate or silicon wafer. In some embodiments, the first substrate 201 has similar configuration as the first substrate layer 101a of the semiconductor structure 100 described above or illustrated in FIG. 1.

In some embodiments, the second substrate 202 may include several circuitries and one or more active elements such as transistors etc. disposed over or in the second substrate 202. In some embodiments, the circuitries formed over or in the second substrate 202 may be any type of circuitry suitable for a particular application. In some embodiments, the second substrate 202 is a CMOS substrate. In some embodiments, the second substrate 202 includes several CMOS components or devices. In some embodiments, the second substrate 202 includes semiconductive materials such as silicon or other suitable materials. In some embodiments, the second substrate 202 is a silicon substrate or silicon wafer. In some embodiments, the second substrate 202 has similar configuration as the second substrate layer 102a of the semiconductor structure 100 described above or illustrated in FIG. 1.

In some embodiments, the dielectric layer 203 is disposed between the first substrate 201 and the second substrate 202. In some embodiments, the dielectric layer 203 is bonded with the first substrate 201 and the second substrate 202. In some embodiments, the dielectric layer 203 is directly bonded or interfaced with a portion of the first substrate 201. In some embodiments, the dielectric layer 203 is directly bonded or interfaced with the second substrate 202. In some embodiments, the dielectric layer 203 is conformal to a surface of the first substrate 201 and a surface of the second substrate 202. In some embodiments, the dielectric layer 203 is aligned with the first substrate 201 and the second substrate 202. In some embodiments, a periphery of the first substrate 201 is aligned with a sidewall 203c of the dielectric layer 203. In some embodiments, a periphery of the second substrate 202 is aligned with the sidewall 203c of the dielectric layer 203.

In some embodiments, the dielectric layer 203 includes dielectric material such as oxide, nitride, silicon dioxide, silicon nitride, silicon oxynitride, silicon carbide, polymer or the like. In some embodiments, the dielectric layer 203 has similar configuration as the first dielectric layer 101b or the second dielectric layer 102b of the semiconductor structure 100 as described above or illustrated in FIG. 1.

In some embodiments, the conductive structure 204 is disposed within the dielectric layer 203. In some embodiments, the conductive structure 204 is surrounded by the dielectric layer 203. In some embodiments, the conductive structure 204 is laterally extended along the periphery 201a of the first substrate 201 or the periphery 202a of the second substrate 202. In some embodiments, the conductive structure 204 is a part of a circuitry of the semiconductor structure 200. In some embodiments, the conductive structure 204 is electrically connected with the circuitry of the first substrate 201 and the circuitry of the second substrate 202. In some embodiments, the conductive structure 204 is a part of a redistribution layer (RDL). In some embodiments, the conductive structure 204 is in a partially closed loop or in a ring shape. In some embodiments, the conductive structure 204 is a bond ring.

In some embodiments, the conductive structure 204 includes conductive or metallic material such as gold, silver, copper, nickel, tungsten, aluminum, tin and/or alloys thereof. In some embodiments, the conductive structure 204 has similar configuration as the first conductive structure 101c or the second conductive structure 102c of the semiconductor structure 100 as described above or illustrated in FIG. 1.

In some embodiments, the chamber 205 is extended from the first substrate 201 to the dielectric layer 203 and enclosed by the first substrate 201 and the dielectric layer 203. In some embodiments, a portion of the chamber 205 is protruded into the dielectric layer 203. In some embodiments, a portion of the chamber 205 is protruded into the first substrate 201. In some embodiments, the chamber 205 is a void inside the semiconductor structure 200. In some embodiments, the chamber 205 is sealed or is hermetic. In some embodiments, the chamber 205 is in vacuum or is at a gas pressure lower than about 1 atmospheric pressure (atm). In some embodiments, the chamber 205 has similar configuration as the cavity 101g of the semiconductor structure 100 as described above or illustrated in FIG. 1.

In some embodiments, the device 206 is disposed within the chamber 205. In some embodiments, the device 206 is displaceable or movable relative to the first substrate 201, the second substrate 202 and the dielectric layer 203. In some embodiments, the device 206 is configured for sensing one or more characteristics such as motion, movement or etc. In some embodiments, the device 206 includes a proof mass for reacting with a motion along a plane. In some embodiments, the device 206 is a MEMS device. In some embodiments, the device 206 is an accelerometer for measuring linear acceleration. In some embodiments, the device 206 is a gyroscope for measuring angular velocity. In some embodiments, the device 206 has similar configuration as the device 101h of the semiconductor structure 100 as described above or illustrated in FIG. 1.

In some embodiments, the interface 207 is disposed within the dielectric layer 203 or the conductive structure 204. In some embodiments, the interface 207 is at least partially across the dielectric layer 203. In some embodiments, the interface 207 is at least partially across the conductive structure 204. In some embodiments, the interface 207 is extended from the sidewall 203c of the dielectric layer 203 towards the chamber 205. In some embodiments, the interface 207 is substantially orthogonal to the sidewall 203c of the dielectric layer 203. In some embodiments, the interface 207 at least partially surrounds the chamber 205. In some embodiments, the interface 207 divides the dielectric layer 203 into an upper portion 203a and a lower portion 203b. In some embodiments, the interface 207 divides the conductive structure 204 into an upper portion 204a and a lower portion 204b. In some embodiments, the interface 207 is identifiable or visible under an electromagnetic radiation with a particular range of wavelength.

Figure 3:
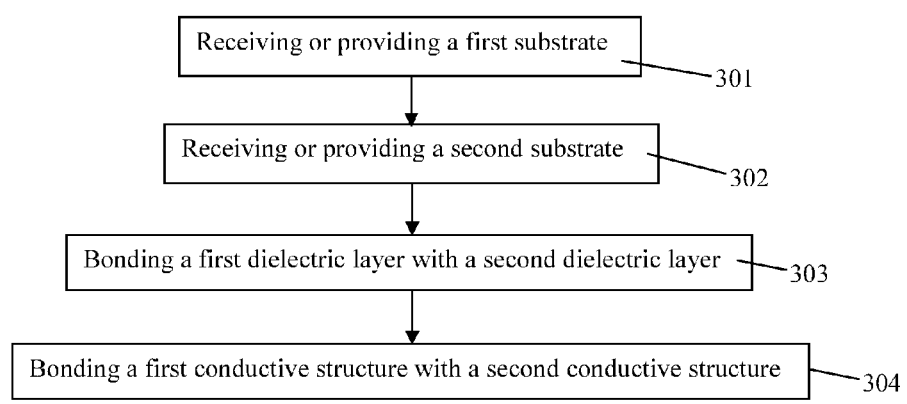
FIG. 3 is a flow diagram of a method of manufacturing a semiconductor structure in accordance with some embodiments of the present disclosure.

In the present disclosure, a method of manufacturing a semiconductor structure (100 or 200) is also disclosed. In some embodiments, the semiconductor structure (100 or 200) is formed by a method 300. The method 300 includes a number of operations and the description and illustration are not deemed as a limitation as the sequence of the operations. FIG. 3 is an embodiment of the method 300 of manufacturing the semiconductor structure (100 or 200). The method 300 includes a number of operations (301, 302, 303 and 304).

Figure 3A:
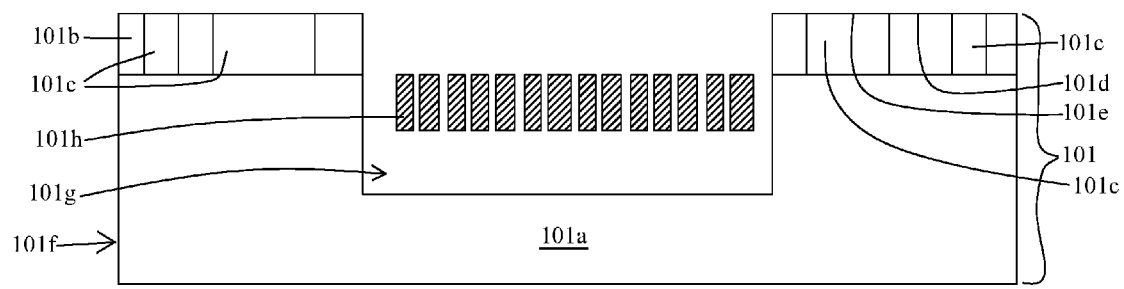
FIGS. 3A-3D are schematic views of manufacturing a semiconductor structure by a method of FIG. 3 in accordance with some embodiments of the present disclosure.

In operation 301, a first substrate 101 is received or provided as shown in FIG. 3A. In some embodiments, the first substrate 101 includes a first substrate layer 101a, a first dielectric layer 101b, a first conductive structure 101c, a cavity 101g and a device 101h. In some embodiments, the first dielectric layer 101b is disposed over the first substrate layer 101a. In some embodiments, the first conductive structure 101c is surrounded by the first dielectric layer 101b. In some embodiments, the first conductive structure 101c is at least partially exposed from the first dielectric layer 101b. In some embodiments, the first substrate 101, the first substrate layer 101a, the first dielectric layer 101b, the first conductive structure 101c, the cavity 101g and the device 101h have similar configurations as in the semiconductor structure 100 described above or illustrated in FIG. 1 or 2.

Figure 3B:
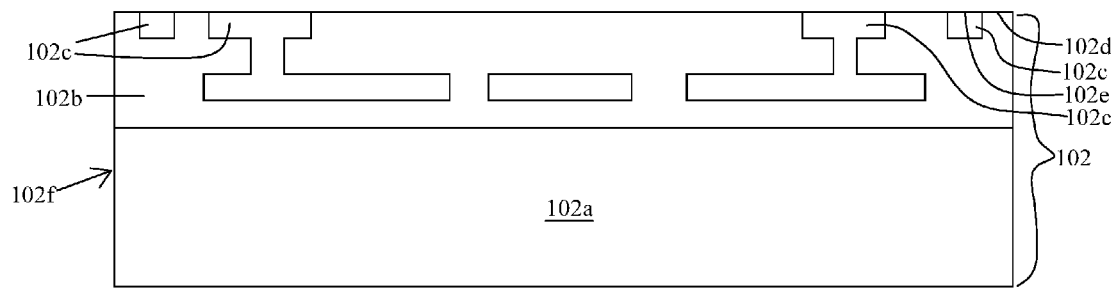
Figure 3B:
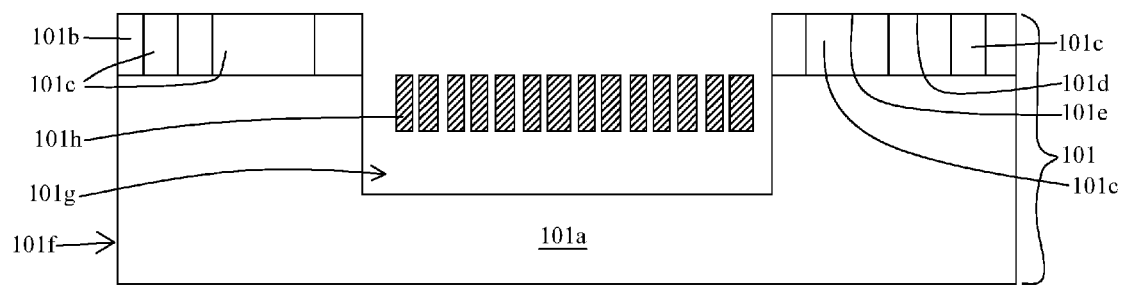

In operation 302, a second substrate 102 is received or provided as shown in FIG. 3B. In some embodiments, the second substrate 102 includes a second substrate layer 102a, a second dielectric layer 102b and a second conductive structure 102c. In some embodiments, the second dielectric layer 102b is disposed over the second substrate layer 102a. In some embodiments, the second conductive structure 102c is surrounded by the second dielectric layer 102b. In some embodiments, the second conductive structure 102c is at least partially exposed from the second dielectric layer 102b. In some embodiments, the second substrate 102, the second substrate layer 102a, the second dielectric layer 102b and the second conductive structure 102c have similar configurations as in the semiconductor structure 100 described above or illustrated in FIG. 1 or 2.

Figure 3C:
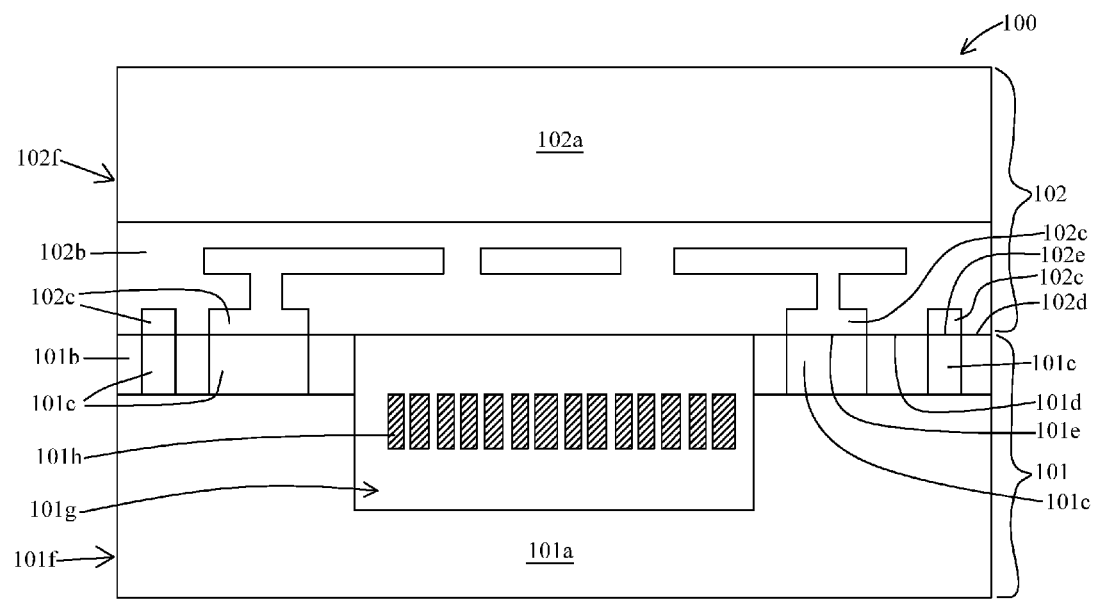
Figure 3D:
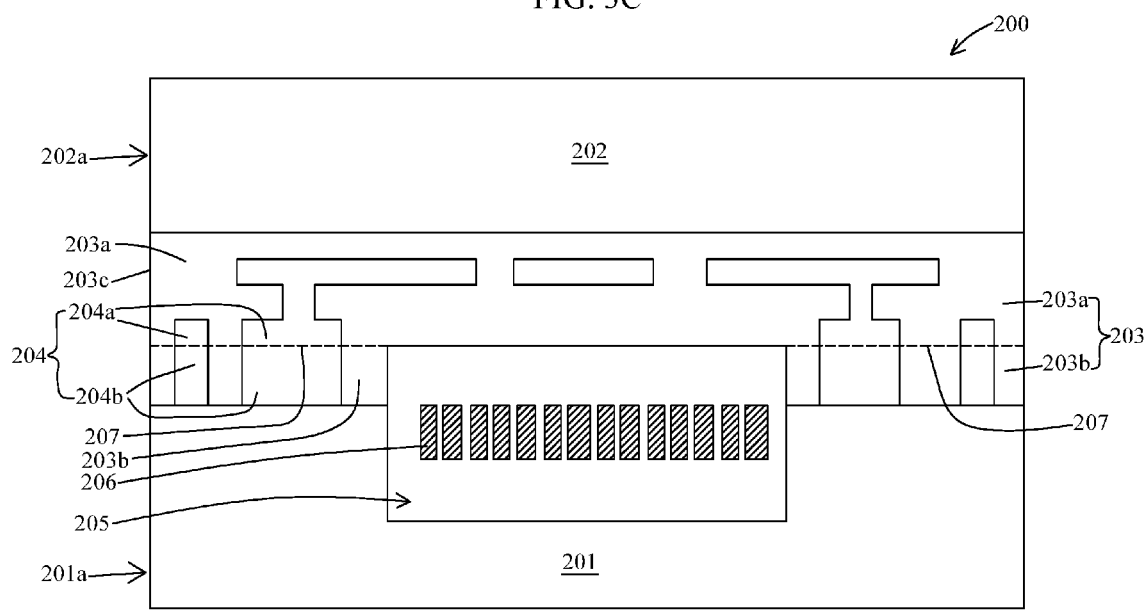

In operation 303, the first dielectric layer 101b is bonded with the second dielectric layer 102b as shown in FIG. 3C or 3D. In some embodiments, the second substrate 102 is flipped and bonded over the first substrate 101. In some embodiments, the first substrate 101 is aligned with the second substrate 102. In some embodiments, the first dielectric layer 101b is aligned with the second dielectric layer 102b. In some embodiments, the first dielectric layer 101b is permanently bonded with the second dielectric layer 102b. In some embodiments, an interface 207 is formed between the first dielectric layer 101b and the second dielectric layer 102b when the first dielectric layer 101b is bonded with the second dielectric layer 102b.

In some embodiments, the first dielectric layer 101b is bonded with the second dielectric layer 102b by direct bonding, fusion bonding operations or any other suitable operations. In some embodiments, the bonding of the first dielectric layer 101b with the second dielectric layer 102b is operated under a temperature of less than about 250° C. In some embodiments, the temperature is less than about 400° C. In some embodiments, the temperature is about 200° C. to about 300° C. In some embodiments, the first dielectric layer 101b can be bonded with the second dielectric layer 102b without an application of an external force over the first substrate 101 or the second substrate 102. In some embodiments, a compressive force of less than about 1000N is applied over the first substrate 101 or the second substrate 102 upon bonding the first dielectric layer 101b with the second dielectric layer 102b. In some embodiments, the compressive force is less than 30000N. Since the bonding of the first dielectric layer 101b with the second dielectric layer 102b is operated at a low temperature (for example, less than 250° C.) and no or small compressive force is applied over the first substrate 101 or the second substrate 102 during the bonding operations, damage on the first substrate 101 and the second substrate 102 could be minimized or prevented.

In operation 304, the first conductive structure 101c is bonded with the second conductive structure 102c as shown in FIG. 3C or 3D. In some embodiments, the second substrate 102 is flipped and bonded over the first substrate 101. In some embodiments, the first substrate 101 is aligned with the second substrate 102. In some embodiments, the first conductive structure 101c is aligned with the second conductive structure 102c. In some embodiments, the first conductive structure 101c is permanently bonded with the second conductive structure 102c. In some embodiments, the interface 207 is formed between the first conductive structure 101c and the second conductive structure 102c when the first conductive structure 101c is bonded with the second conductive structure 102c.

In some embodiments, the first conductive structure 101c is bonded with the second conductive structure 102c by direct bonding, fusion bonding operations or any other suitable operations. In some embodiments, the bonding of the first conductive structure 101c with the second conductive structure 102c is operated under a temperature of less than about 250° C. In some embodiments, the temperature is less than about 400° C. In some embodiments, the temperature is about 200° C. to about 300° C. In some embodiments, the first conductive structure 101c can be bonded with the second conductive structure 102c without an application of an external force over the first substrate 101 or the second substrate 102. In some embodiments, a compressive force of less than about 1000N is applied over the first substrate 101 or the second substrate 102 upon bonding the first conductive structure 101c with the second conductive structure 102c. In some embodiments, the compressive force is less than 30000N. Since the bonding of the first conductive structure 101c with the second conductive structure 102c is operated at a low temperature (for example, less than 250° C.) and no or small compressive force is applied over the first substrate 101 or the second substrate 102 during the bonding operations, damage on the first substrate 101 and the second substrate 102 could be minimized or prevented.

In some embodiments, the operation 303 and the operation 304 are performed simultaneously, that the bonding of the first dielectric layer 101b with the second dielectric layer 102b and the bonding of the first conductive structure 101c with the second conductive structure 102c are performed simultaneously. In some embodiments, the semiconductor structure (100 or 200) as shown in FIG. 3C or 3D is formed. In some embodiments, the semiconductor structure 100 in FIG. 3C has similar configuration as the semiconductor structure 100 in FIG. 1. In some embodiments, the semiconductor structure 200 in FIG. 3D has similar configuration as the semiconductor structure 200 in FIG. 2.

Figure 4:
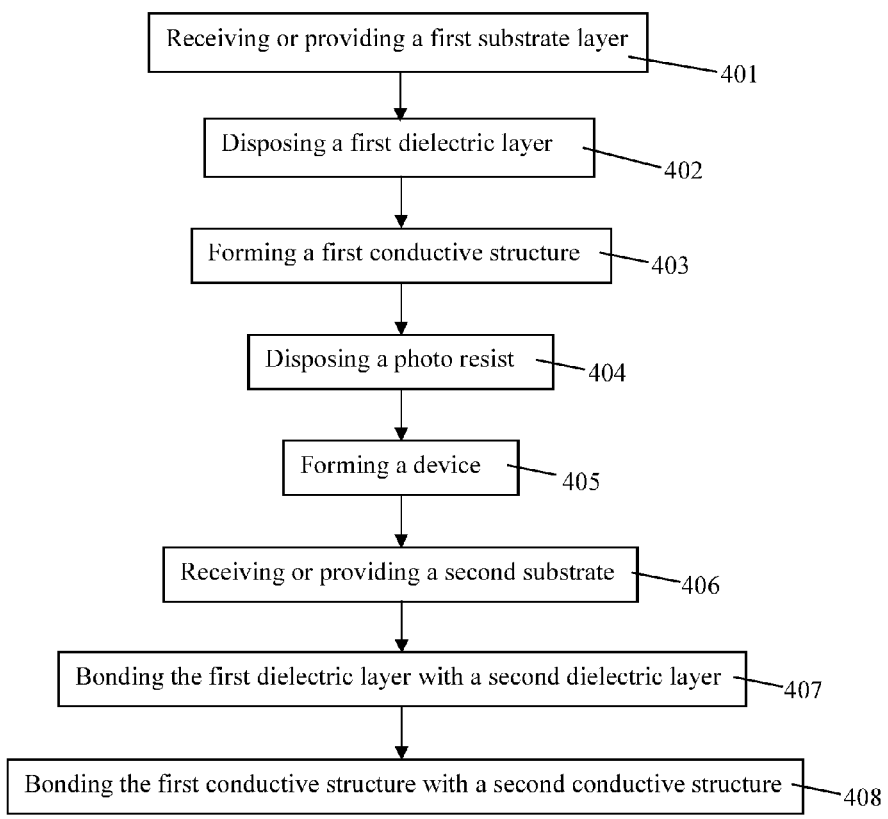
FIG. 4 is a flow diagram of a method of manufacturing a semiconductor structure in accordance with some embodiments of the present disclosure.

In the present disclosure, a method of manufacturing a semiconductor structure (100 or 200) is also disclosed. In some embodiments, the semiconductor structure (100 or 200) is formed by a method 400. FIG. 4 is an embodiment of the method 400 of manufacturing the semiconductor structure (100 or 200). The method 400 includes a number of operations (401, 402, 403, 404, 405, 406, 407 and 408).

Figure 4A:
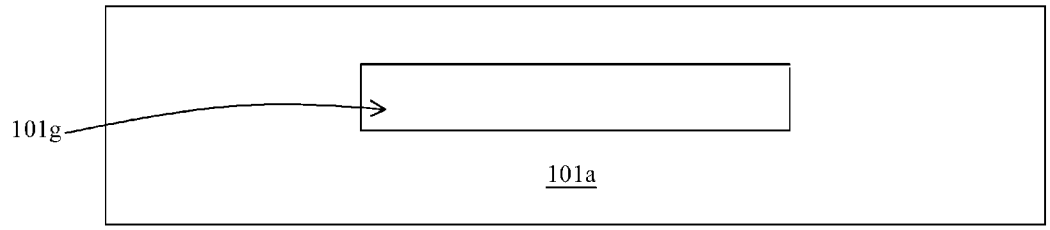
FIGS. 4A-4I are schematic views of manufacturing a semiconductor structure by a method of FIG. 4 in accordance with some embodiments of the present disclosure.

In operation 401, a first substrate layer 101a is received or provided as shown in FIG. 4A. In some embodiments, the first substrate layer 101a includes a cavity 101g disposed within the first substrate layer 101a. In some embodiments, the first substrate layer 101a includes a first silicon substrate, a second silicon substrate and an oxide layer disposed between the first silicon substrate and the second silicon substrate. In some embodiments, the first substrate layer 101a having the cavity 101g within the first substrate layer 101a is formed by removing a portion of the first silicon substrate to form the cavity 101g, disposing the oxide layer over the first silicon substrate and disposing the second silicon substrate over the oxide layer to cover the cavity 101g. In some embodiments, the portion of the first substrate layer 101a is removed by photolithography, etching or other suitable operations. In some embodiments, the first silicon substrate is bonded with the second silicon substrate through the oxide layer, that the second silicon substrate is bonded with the oxide layer by fusion bonding or any other suitable operations. In some embodiments, a thickness of the second silicon substrate is thinned down by backside grinding, etching or any other suitable operations.

Figure 4B:
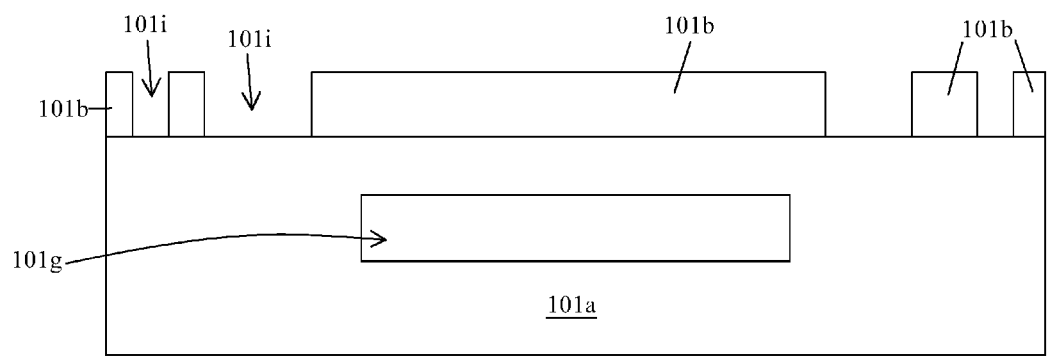

In operation 402, a first dielectric layer 101b is disposed over the first substrate layer 101a as shown in FIG. 4B. In some embodiments, the first dielectric layer 101b is disposed over the first substrate layer 101a by deposition or any other suitable operations. In some embodiments, the first dielectric layer 101b is patterned by removing a portion of the first dielectric layer 101b. In some embodiments, the portion of the first dielectric layer 101b is removed by etching or any other suitable operations. In some embodiments, the first substrate layer 101a is partially exposed from the first dielectric layer 101b. IN some embodiments, the first dielectric layer 101b includes a first recess 101i exposing a portion of the first substrate layer 101a. In some embodiments, the first dielectric layer 101b has similar configuration as described above or illustrated in FIG. 1 or 2.

Figure 4C:
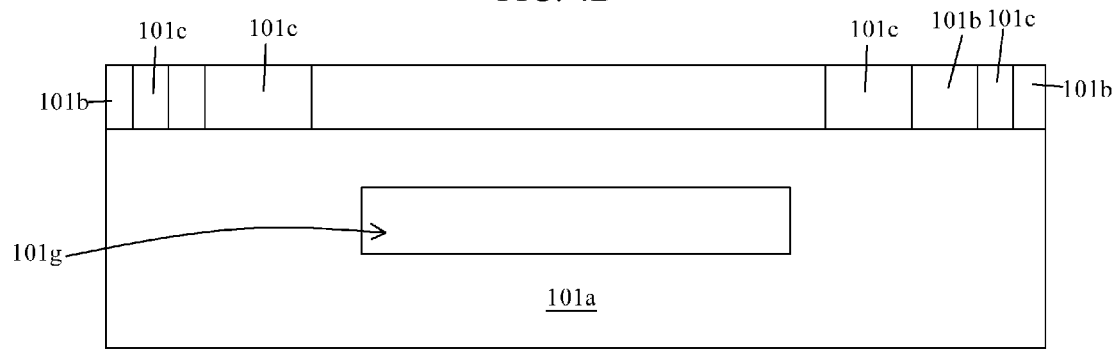

In operation 403, a first conductive structure 101c is formed as shown in FIG. 4C. In some embodiments, the first conductive structure 101c is formed by damascene operations. In some embodiments, the first conductive structure 101c is formed by disposing a conductive material such as copper over the first dielectric layer 101b, filling the first recess 101i by the conductive material and removing the excess conductive material on the first dielectric layer 101b. In some embodiments, the conductive material is disposed by electroplating, sputtering or any other suitable operations. In some embodiments, the excess conductive material is removed by chemical mechanical planarization (CMP) or any other suitable operations. In some embodiments, a barrier layer such as titanium nitride and a seed layer such as copper are disposed conformal to the first recess 101i and a surface of the first dielectric layer 101b before disposing the conductive material.

Figure 4D:
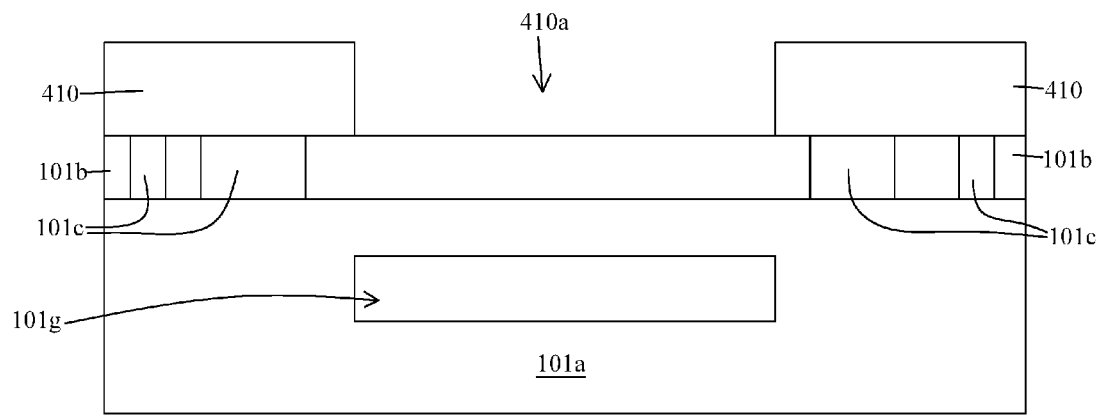

In operation 404, a photo resist 410 is disposed over the first dielectric layer 101b as shown in FIG. 4D. In some embodiments, the photo resist 410 is patterned to become a photomask. In some embodiments, the photo resist 410 is patterned by deposition and photolithography or any other suitable operations. In some embodiments, the photo resist 410 includes a second recess 410a exposing a portion of the first dielectric layer 101b.

Figure 4E:
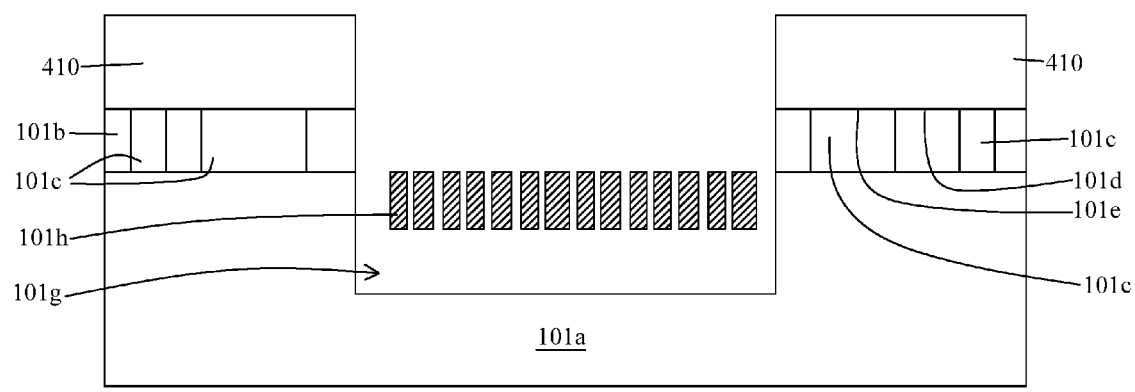
Figure 4F:
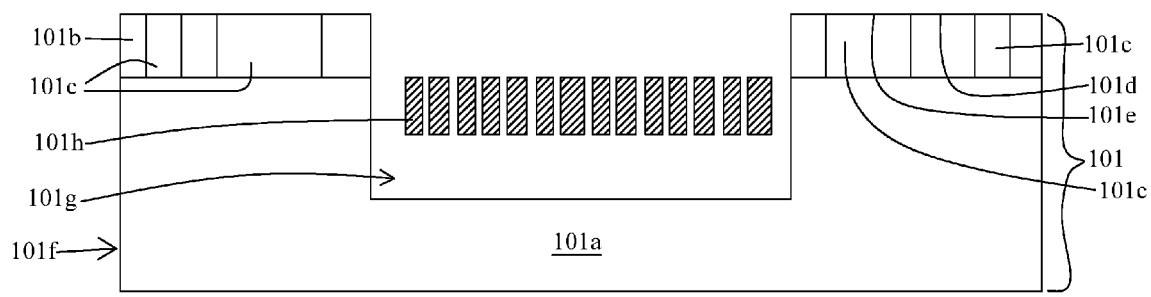

In operation 405, a device 101h is formed as shown in FIG. 4E or 4F. In some embodiments as shown in FIG. 4E, the first dielectric layer 101b exposed from the photo resist 410 and a portion of the first substrate layer 101a under the second recess 410a are removed by etching or any other suitable operations to form the device 101h. In some embodiments, the device 101h is formed by removing several portions of the first substrate layer 101a. In some embodiments, the device 101h is disposed within the cavity 101g. In some embodiments, as shown in FIG. 4F, the photo resist 410 is removed by etching, stripping or any other suitable operations after the formation of the device 101h. In some embodiments, the device 101h and the cavity 101g have similar configuration as described above or illustrated in FIG. 1 or 2. In some embodiments, the first substrate 101 is formed as shown in FIG. 4F. In some embodiments, the first substrate 101 has similar configuration as described above or illustrated in FIG. 1 or 2.

Figure 4G:
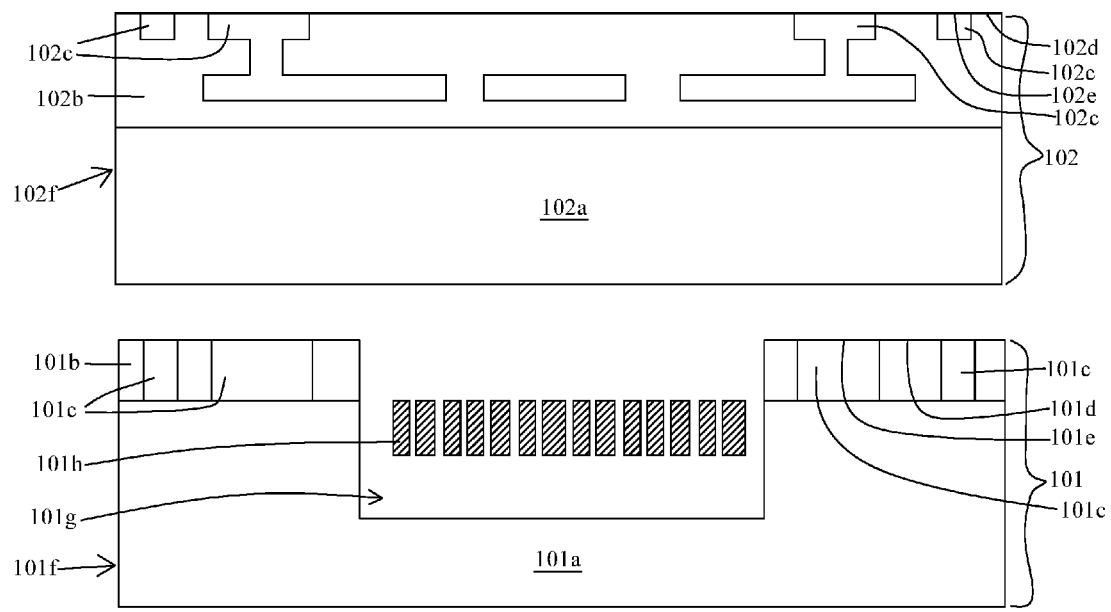

In operation 406, a second substrate 102 is received or provided as shown in FIG. 4G. In some embodiments, the operation 406 is similar to the operation 302 as described above or illustrated in FIG. 3B.

Figure 4H:
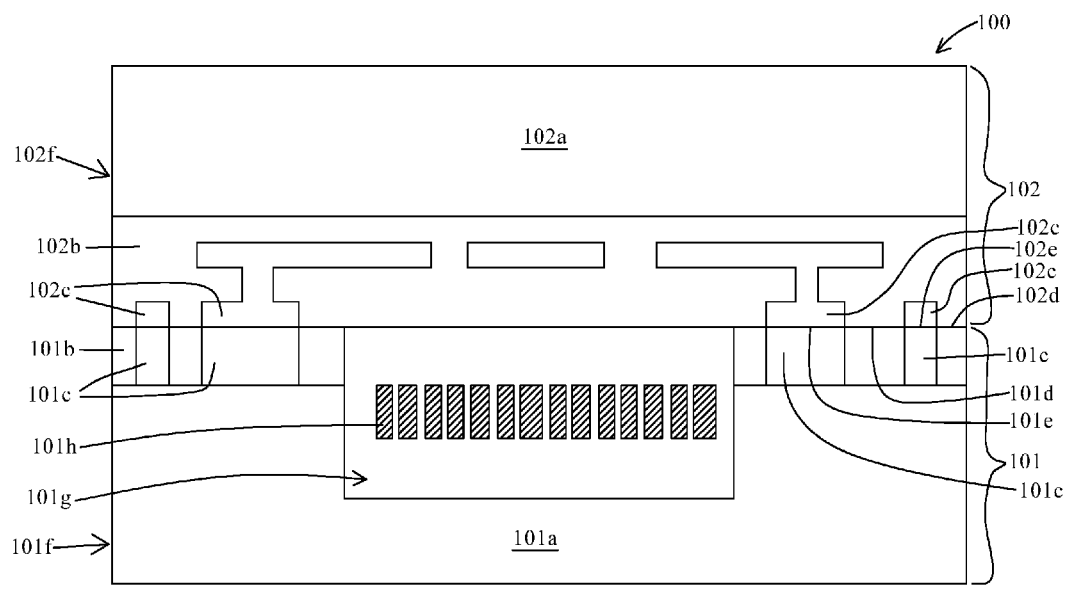
Figure 4I:
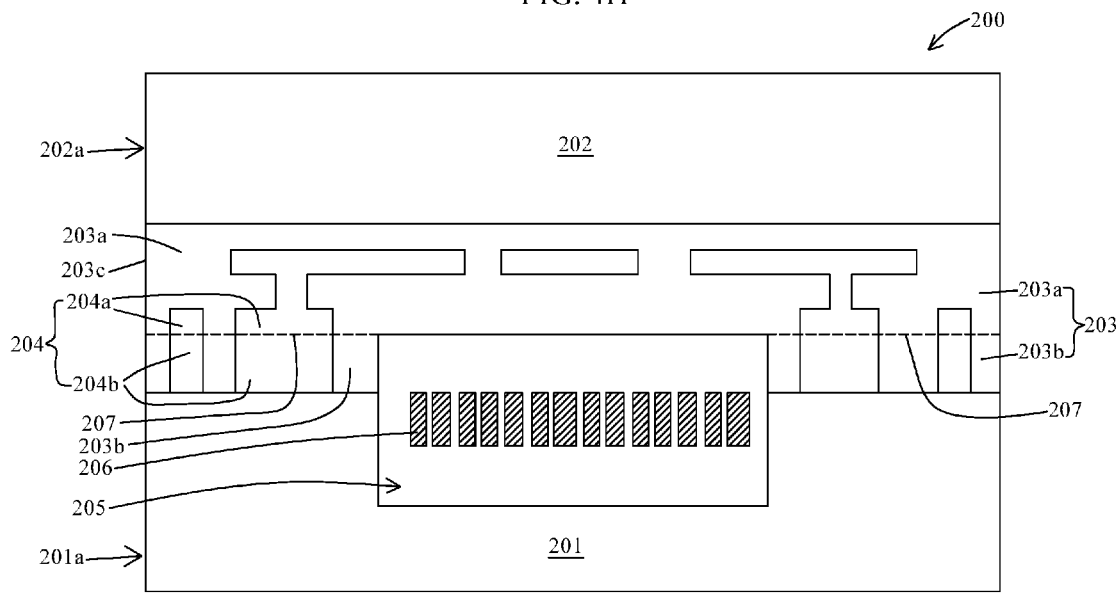

In operation 407, the first dielectric layer 101b of the first substrate 101 is bonded with a second dielectric layer 102b of the second substrate 102 as shown in FIG. 4H or 4I. In some embodiments, the operation 407 is similar to the operation 303 as described above or illustrated in FIG. 3C or 3D.

In operation 408, the first conductive structure 101c is bonded with a second conductive structure 102c of the second substrate 102 as shown in FIG. 4H or 4I. In some embodiments, the operation 408 is similar to the operation 304 as described above or illustrated in FIG. 3C or 3D.

In some embodiments, the operation 407 and the operation 408 are performed simultaneously. In some embodiments, the cavity 101g or the chamber 205 is sealed after the operation 407 and the operation 408. In some embodiments, the semiconductor structure (100 or 200) as shown in FIG. 4H or 4I is formed after the operation 407 and the operation 408. In some embodiments, the semiconductor structure (100 or 200) has similar configuration as described above or illustrated in FIG. 1 or 2.

The present disclosure is directed to a semiconductor structure including a substrate bonded with another substrate under a low temperature while without a high compressive force. Each substrate includes a dielectric layer and a conductive structure. The dielectric layers of substrates are bonded with each other, and the conductive structures of substrates are bonded with each other. Such direct bonding or fusion bonding does not require high temperature and high compressive force over the substrates, therefore the semiconductor structure would not be damaged during bonding operations. A reliability of the semiconductor structure is improved.

In some embodiments, a semiconductor structure includes a first substrate including a cavity extended into the first substrate, a device disposed within the cavity, a first dielectric layer disposed over the first substrate and a first conductive structure surrounded by the first dielectric layer; and a second substrate including a second dielectric layer disposed over the second substrate and a second conductive structure surrounded by the second dielectric layer, wherein the first conductive structure is bonded with the second conductive structure and the first dielectric layer is bonded with the second dielectric layer to seal the cavity.

In some embodiments, the first conductive structure is aligned with the second conductive structure, or the first substrate is aligned with the second substrate. In some embodiments, the first conductive structure is complementary to the second conductive structure. In some embodiments, a top surface of the first conductive structure is at a same level as a top surface of the first dielectric layer, or a top surface of the second conductive structure is a same level as a top surface of the second dielectric layer. In some embodiments, the cavity is enclosed by the first substrate, the first dielectric layer and the second dielectric layer. In some embodiments, the first conductive structure is extended along a periphery of the first substrate, or the second conductive structure is extended along a periphery of the second substrate. In some embodiments, the first conductive structure or the second conductive structure is in a partially closed loop or in a ring shape. In some embodiments, the first conductive structure or the second conductive structure is electrically connected with a circuitry disposed over the second substrate. In some embodiments, the first conductive structure and the second conductive structure include copper, and the first dielectric layer and the second dielectric layer include oxide or nitride. In some embodiments, the device is an accelerometer or includes a proof mass. In some embodiments, the cavity is in vacuum.

In some embodiments, a semiconductor structure, comprising: a first substrate; a second substrate disposed opposite to the first substrate; a dielectric layer disposed between the first substrate and the second substrate; a conductive structure disposed within the dielectric layer; a chamber extended from the first substrate to the dielectric layer and enclosed by the first substrate and the dielectric layer; and a device disposed within the chamber, wherein an interface is disposed within the dielectric layer or the conductive structure, and is extended from a sidewall of the dielectric layer towards the chamber and at least partially across the dielectric layer or the conductive structure.

In some embodiments, the interface is substantially orthogonal to the sidewall of the dielectric layer. In some embodiments, the interface divides the dielectric layer into an upper portion and a lower portion, or the interface divides the conductive structure into an upper portion and a lower portion. In some embodiments, the interface at least partially surrounds the chamber. In some embodiments, the chamber is hermetic.

In some embodiments, a method of manufacturing a semiconductor structure, comprising: receiving a first substrate including a first dielectric layer disposed over the first substrate and a first conductive structure surrounded by the first dielectric layer; receiving a second substrate including a second dielectric layer disposed over the second substrate and a second conductive structure surrounded by the second dielectric layer; bonding the first dielectric layer with the second dielectric layer; and bonding the first conductive structure with the second conductive structure.

In some embodiments, the bonding the first dielectric layer with the second dielectric layer and the bonding the first conductive structure with the second conductive structure are performed simultaneously. In some embodiments, the bonding the first dielectric layer with the second dielectric layer and the bonding the first conductive structure with the second conductive structure are operated under a temperature of less than about 250° C. In some embodiments, the first dielectric layer is bonded with the second dielectric layer by fusion bonding operations, or the first conductive structure is bonded with the second conductive structure by fusion bonding operations.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first substrate including a cavity extending into the first substrate, a device disposed within the cavity, a first dielectric layer disposed over the first substrate and a first conductive structure surrounded by the first dielectric layer; and
   a second substrate including a semiconductive substrate layer, a second dielectric layer disposed over the semiconductive substrate layer and a second conductive structure surrounded by the second dielectric layer,
   wherein the first conductive structure is interfaced with the second conductive structure, the first dielectric layer is interfaced with the second dielectric layer to seal the cavity, the second dielectric layer provides a top surface to the cavity, the semiconductive substrate layer of the second substrate is isolated from the cavity by the second dielectric layer, and the cavity is in vacuum.

2. The semiconductor structure of claim 1, wherein the first conductive structure is aligned with the second conductive structure, or the first substrate is aligned with the second substrate.

3. The semiconductor structure of claim 1, wherein the first conductive structure is complementary to the second conductive structure.

4. The semiconductor structure of claim 1, wherein a top surface of the first conductive structure is at a same level as a top surface of the first dielectric layer, or a top surface of the second conductive structure is at a same level as a top surface of the second dielectric layer.

5. The semiconductor structure of claim 1, wherein the cavity is enclosed by the first substrate, the first dielectric layer and the second dielectric layer.

6. The semiconductor structure of claim 1, wherein the first conductive structure is extended along a periphery of the first substrate, or the second conductive structure is extended along a periphery of the second substrate.

7. The semiconductor structure of claim 1, wherein the first conductive structure or the second conductive structure is in a partially closed loop or in a ring shape.

8. The semiconductor structure of claim 1, wherein the first conductive structure or the second conductive structure is electrically connected with a circuitry disposed over the second substrate.

9. The semiconductor structure of claim 1, wherein the first conductive structure and the second conductive structure include copper, and the first dielectric layer and the second dielectric layer include oxide or nitride.

10. The semiconductor structure of claim 1, wherein the device is an accelerometer or includes a proof mass.

11. A semiconductor structure, comprising:
a first substrate;
a second substrate disposed opposite to the first substrate and comprising a semiconductive substrate layer;
a dielectric layer disposed between the first substrate and the second substrate;
a conductive structure disposed within the dielectric layer;
a chamber extending from the first substrate to the dielectric layer and enclosed by the first substrate and the dielectric layer, wherein the chamber is at a gas pressure; and
a device disposed within the chamber,
wherein an interface is disposed within the dielectric layer and the conductive structure, and extends from a sidewall of the dielectric layer towards the chamber and at least partially across the dielectric layer and the conductive structure, wherein the dielectric layer provides the chamber with a top surface and a sidewall, and the semiconductive substrate layer of the second substrate is isolated from the chamber by the dielectric layer.

12. The semiconductor structure of claim 11, wherein the interface is substantially orthogonal to the sidewall of the dielectric layer.

13. The semiconductor structure of claim 11, wherein the interface divides the dielectric layer into an upper portion and a lower portion, or the interface divides the conductive structure into an upper portion and a lower portion.

14. The semiconductor structure of claim 11, wherein the interface at least partially surrounds the chamber.

15. The semiconductor structure of claim 11, wherein the chamber is hermetic.

16. A semiconductor structure, comprising:
a first substrate including a cavity extending into the first substrate, a MEMS device disposed within the cavity, a first dielectric layer disposed over the first substrate, and a first conductive structure at least partially exposed through the first dielectric layer; and
a second substrate including a semiconductive substrate layer, a second dielectric layer disposed over the semiconductive substrate layer and a second conductive structure at least partially exposed through the second dielectric layer,
wherein the first conductive structure exposed through the first dielectric layer is interfaced with the second conductive structure exposed through the second dielectric layer, the first dielectric layer is interfaced with the second dielectric layer, the second dielectric layer provides a top surface to the cavity, the semiconductive substrate layer of the second substrate is isolated from the cavity by the second dielectric layer, and the cavity is at a gas pressure lower than about 1 atmospheric pressure (atm).

17. The semiconductor structure of claim 16, wherein a first interface between the first conductive structure and the second conductive structure is at substantially same level as a second interface between the first dielectric layer and the second dielectric layer.

18. The semiconductor structure of claim 16, wherein the first conductive structure is contacted with the second conductive structure.

19. The semiconductor structure of claim 16, wherein the cavity is enclosed by the first conductive structure or the second conductive structure.

20. The semiconductor structure of claim 11, wherein the gas pressure is lower than 1 atmospheric pressure (atm).

* * * * *